United States Patent
Jeon et al.

(10) Patent No.: US 12,058,919 B2
(45) Date of Patent: Aug. 6, 2024

(54) DISPLAY APPARATUS MANUFACTURING METHOD AND DISPLAY APPARATUS MANUFACTURING SYSTEM

(71) Applicant: SAMSUNG DISPLAY CO., LTD., Yongin-si (KR)

(72) Inventors: Woosik Jeon, Yongin-si (KR); Eonseok Oh, Yongin-si (KR); Sangyeol Kim, Yongin-si (KR); Hanggochnuri Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/405,451

(22) Filed: May 7, 2019

(65) Prior Publication Data
US 2020/0035957 A1    Jan. 30, 2020

(30) Foreign Application Priority Data
Jul. 24, 2018    (KR) .................. 10-2018-0085927

(51) Int. Cl.
*H10K 71/00* (2023.01)
*H10K 50/805* (2023.01)
(Continued)

(52) U.S. Cl.
CPC .......... *H10K 71/00* (2023.02); *H10K 50/805* (2023.02); *H10K 50/87* (2023.02); *H10K 59/10* (2023.02); *H10K 71/40* (2023.02)

(58) Field of Classification Search
None
See application file for complete search history.

(56) References Cited

U.S. PATENT DOCUMENTS

2004/0178723 A1* 9/2004 Yasukawa ........... H01L 51/5253
                                                              313/506
2008/0093978 A1* 4/2008 Mori .................... H10K 59/173
                                                              313/498
(Continued)

FOREIGN PATENT DOCUMENTS

CN    102738408 A    10/2012
JP    H07-307274 A    11/1995
(Continued)

OTHER PUBLICATIONS

CRC Handbook of Chemistry and Physics, 63rd ed., p. E-201 (Year: 1983).*

(Continued)

*Primary Examiner* — Erik Kielin
(74) *Attorney, Agent, or Firm* — Lewis Roca Rothgerber Christie LLP

(57) ABSTRACT

A display apparatus manufacturing method includes preparing a substrate, forming, on the substrate, a display preliminary structure including at least one first electrode, arranging, in a processing chamber, the substrate on which the display preliminary structure is formed, and irradiating ultraviolet rays onto the substrate while maintaining a pressure atmosphere in the processing chamber lower than an atmospheric pressure, forming an intermediate layer on the display preliminary structure, the intermediate layer including an emission layer, and forming a second electrode on the intermediate layer.

10 Claims, 18 Drawing Sheets

(51) Int. Cl.
*H10K 50/87* (2023.01)
*H10K 59/10* (2023.01)
*H10K 71/40* (2023.01)

(56) References Cited

U.S. PATENT DOCUMENTS

| | | | | |
|---|---|---|---|---|
| 2008/0164810 | A1* | 7/2008 | Oda | H01L 27/3258 |
| | | | | 313/504 |
| 2009/0140270 | A1 | 6/2009 | Takahashi et al. | |
| 2011/0006300 | A1* | 1/2011 | Mochizuki | H01L 29/7869 |
| | | | | 257/E29.095 |
| 2012/0248422 | A1* | 10/2012 | Mine | H01L 51/5256 |
| | | | | 257/40 |
| 2013/0140543 | A1* | 6/2013 | Harada | H01L 51/5088 |
| | | | | 257/40 |
| 2013/0328039 | A1* | 12/2013 | Ohuchi | H01L 27/3244 |
| | | | | 257/40 |
| 2014/0231787 | A1* | 8/2014 | Ishige | H01L 51/5004 |
| | | | | 257/40 |
| 2015/0136186 | A1* | 5/2015 | Brown | H01L 21/67115 |
| | | | | 134/113 |
| 2016/0276493 | A1* | 9/2016 | Yamazaki | H01L 29/78648 |

FOREIGN PATENT DOCUMENTS

| | | | |
|---|---|---|---|
| JP | H09-186110 A | | 7/1997 |
| JP | 11207171 A | * | 8/1999 |
| JP | 2000-353593 A | | 12/2000 |
| JP | 2005-310471 A | | 11/2005 |
| JP | 2006-019087 A | | 1/2006 |
| JP | 2007-234310 A | | 9/2007 |
| JP | 2011-096839 A | | 5/2011 |
| JP | 5677433 | | 1/2015 |
| KR | 10-2006-0086008 A | | 7/2006 |
| KR | 10-2014-0085953 A | | 7/2014 |
| KR | 10-2016-0115398 | | 10/2016 |

OTHER PUBLICATIONS

Machine language translation of JP 11207171 A. (Year: 1999).*
CRC Handbook of Chemistry and Physics, 63rd ed., pp. C-70, C-572, C-573 (Year: 1983).*
Machine Translation/Relevant Part; JP 2011-096839 A as listed above; 1 page.
Chinese Notification of First Office Action, for Patent Application No. 201910665031.1, dated Dec. 12, 2023, 10 pages.

* cited by examiner

DISPLAY APPARATUS MANUFACTURING METHOD AND DISPLAY APPARATUS MANUFACTURING SYSTEM

CROSS-REFERENCE TO RELATED APPLICATION

Korean Patent Application No. 10-2018-0085927, filed on Jul. 24, 2018, in the Korean Intellectual Property Office, and entitled: "Display Apparatus Manufacturing Method and Display Apparatus Manufacturing System," is incorporated by reference herein in its entirety.

BACKGROUND

1. Field

One or more embodiments relate to a display apparatus manufacturing method and a display apparatus manufacturing system.

2. Description of the Related Art

Recently, the uses of a display apparatus have been diversified. In particular, a display apparatus may have a small thickness and may be lightweight. Thus, a range of use thereof is being expanded.

SUMMARY

Embodiments are directed to a display apparatus manufacturing method, including preparing a substrate, forming, on the substrate, a display preliminary structure including at least one first electrode, arranging, in a processing chamber, the substrate on which the display preliminary structure is formed, and irradiating ultraviolet rays onto the substrate while maintaining a pressure atmosphere in the processing chamber lower than an atmospheric pressure, forming an intermediate layer on the display preliminary structure, the intermediate layer including an emission layer, and forming a second electrode on the intermediate layer.

The pressure atmosphere in the processing chamber may be lower than or equal to 0.01 Pa.

Irradiating the ultraviolet rays may include irradiating ultraviolet rays having a wavelength range less than or equal to 480 nm.

Irradiating the ultraviolet rays may be performed for a time less than or equal to 1 hour.

Irradiating the ultraviolet rays may include irradiating the ultraviolet rays by using an ultraviolet ray irradiator that faces the substrate after arranging the substrate on which the display preliminary structure is formed in the processing chamber.

Irradiating the ultraviolet rays may include irradiating the ultraviolet rays by using a plurality of ultraviolet ray irradiators that face the substrate.

The display apparatus manufacturing method may further include heating the processing chamber by using a heater during the irradiating of ultraviolet rays.

The display apparatus manufacturing method may further include irradiating infrared rays during the irradiating of the ultraviolet rays.

The display apparatus manufacturing method may further include performing a cleaning process on the substrate on which the display preliminary structure is formed before arranging the substrate in the processing chamber.

The display apparatus manufacturing method may further include performing a cleaning process on the substrate on which the display preliminary structure is formed after irradiating the ultraviolet rays and before forming the intermediate layer.

The display apparatus manufacturing method may further include performing a thermal treatment process on the substrate before arranging the substrate.

Forming the display preliminary structure may include forming a pixel-defining layer on the at least one first electrode such that a region of the at least one first electrode is exposed.

Forming the display preliminary structure may include forming a thin-film transistor electrically connected to the at least one first electrode.

The display apparatus manufacturing method may further include forming an encapsulation portion on the second electrode after forming the second electrode.

Embodiments are also directed to a display apparatus manufacturing system including a processing chamber provided such that a substrate is arrangeable therein and an ultraviolet ray irradiator to irradiate ultraviolet rays onto the substrate. The inside of the processing chamber may maintain a pressure atmosphere lower than or equal to atmospheric pressure while the substrate is in the processing chamber.

The processing chamber may control pressure by being connected to a pump.

The ultraviolet ray irradiator may include a plurality of ultraviolet ray irradiators.

The display apparatus manufacturing system may further include a heater to heat the substrate while the substrate is in the processing chamber.

The display apparatus manufacturing system may further include an infrared ray irradiator to irradiate infrared rays onto the substrate while the substrate is arranged in the processing chamber.

The ultraviolet ray irradiator may irradiate ultraviolet rays in a wavelength range less than or equal to 480 nm.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
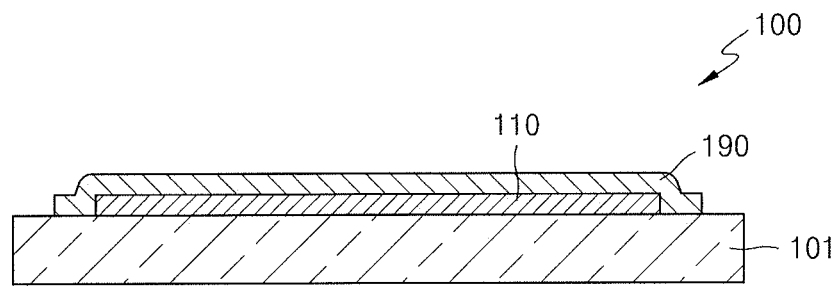
FIG. 1 illustrates a cross-sectional view of an example of a display apparatus manufactured via a display apparatus manufacturing method according to an embodiment.
Figure 1:
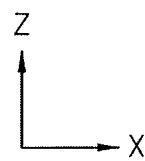

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 illustrates a cross-sectional view of an example of a display apparatus 100 manufactured via a display apparatus manufacturing method according to an embodiment.

Referring to FIG. 1, the display apparatus 100 may include a substrate 101, a display 110, and an encapsulation portion 190.

The substrate 101 may be formed using various materials, such as transparent or opaque materials. In some implementations, the substrate 101 may be formed using a flexible material. Details regarding the substrate 101 are described below.

The display 110 may be provided on the substrate 101. The display 110 may include at least one display device. The display 110 may be used to provide an image recognizable by a user. Details regarding the display 110 are described below.

The encapsulation portion 190 may be provided on the display 110 to protect the display 110. The encapsulation portion 190 may cover or seal the display 110 to protect the display 110 and prevent or reduce penetration of moisture or a gas.

According to an embodiment, the encapsulation portion 190 may have a thin-film form. The encapsulation portion 190 may include, for example, one layer or a plurality of layers.

For example, the encapsulation portion 190 may include at least one layer including an inorganic material, such as silicon oxide or silicon nitride, and at least one layer including an organic material, such as epoxy or polyimide. As another example, the encapsulation portion 190 may have a structure in which the layer including the inorganic material and the layer including the organic material are alternately stacked.

Figure 2:
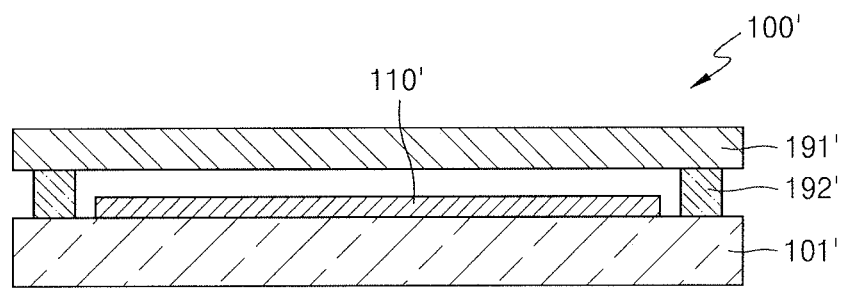
FIG. 2 illustrates a cross-sectional view of another example of a display apparatus manufactured via a display apparatus manufacturing method according to an embodiment.
Figure 2:
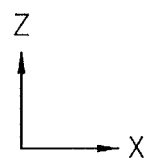

FIG. 2 illustrates a cross-sectional view of another example of a display apparatus 100' manufactured via a display apparatus manufacturing method according to an embodiment.

Referring to FIG. 2, the display apparatus 100' may include a substrate 101', a display 110', an encapsulation substrate 191', and a sealing portion 192'.

The substrate 101' and the display 110' may be the same as or similar to those of FIG. 1.

The encapsulation substrate 191' may face the substrate 101' and the display 110' may be arranged between the substrate 101' and the encapsulation substrate 191'.

The encapsulation substrate 191' may be formed of various materials, such as a light transmitting material. In some implementations, the encapsulation substrate 191' may be formed of a material that is opaque when light is emitted in a direction of the substrate 101'.

The sealing portion 192' may combine the substrate 101' with the encapsulation substrate 191'. For example, a space between the substrate 101' and the encapsulation substrate 191' may be sealed by the sealing portion 192'. According to an embodiment, a moisture absorbent or a filler may be arranged in such a sealed space.

FIGS. 3 through 21 illustrate cross-sectional views for explaining stages of a display apparatus manufacturing method, according to an embodiment.

Figure 3:
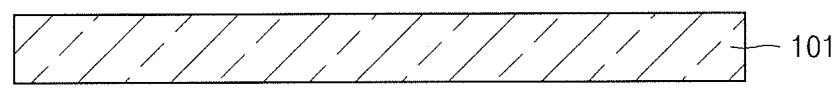
FIGS. 3 through 21 illustrate cross-sectional views for explaining stages pf a display apparatus manufacturing method, according to an embodiment.
Figure 3:
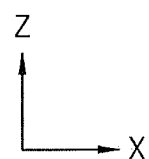

First, referring to FIG. 3, the substrate 101 may be prepared.

The substrate 101 may be formed of a suitable material. For example, the substrate 101 may be formed of glass, a metal, or an organic material.

According to an, the substrate 101 may be formed of a flexible material. For example, the substrate 101 may be formed of a material capable of being bent, curved, folded, or rolled. The flexible material forming the substrate 101 may include ultra-thin glass, a metal, or plastic.

The substrate 101 may include, for example, polyimide (PI) or another type of plastic.

Figure 4:
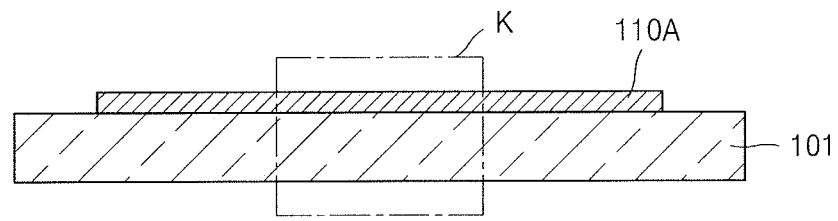
Figure 4:
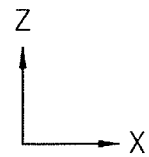

Referring to FIG. 4, a display preliminary structure 110A may be formed on the substrate 101. The display preliminary structure 110A is a structure that includes at least a first electrode. The display preliminary structure 110A may be a region where a display is formed via subsequent processes.

The display preliminary structure 110A is described in detail with reference to FIGS. 5 through 7.

Figure 5:
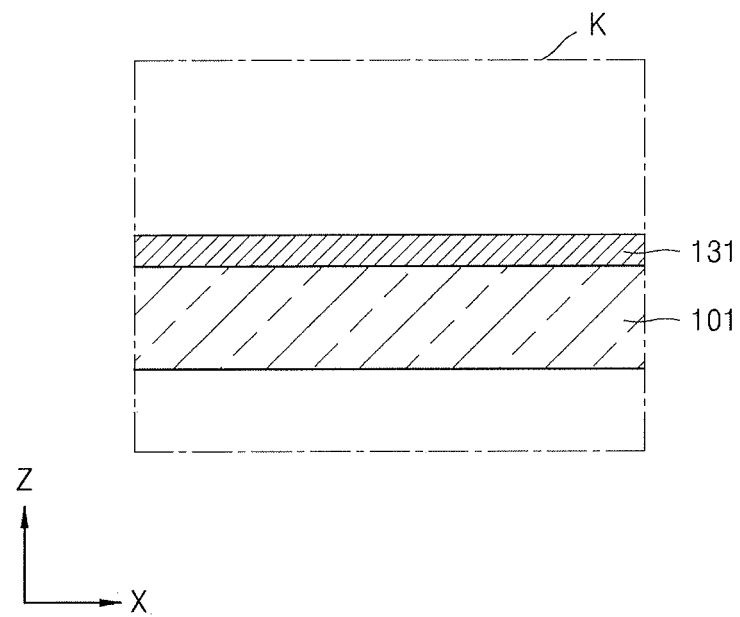

FIG. 5 illustrates an enlarged view of a region K of FIG. 4.

Referring to FIG. 5, a first electrode 131 may be formed on the substrate 101.

The first electrode 131 may function as an anode, and a second electrode described below may function as a cathode. In some implementations, the polarities may be switched.

The first electrode 131 may include indium tin oxide (ITO), indium zinc oxide (IZO), zinc oxide (ZnO), or indium oxide ($In_2O_3$). Based on the use and design conditions, the first electrode 131 may further include a reflective film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca).

Figure 6:
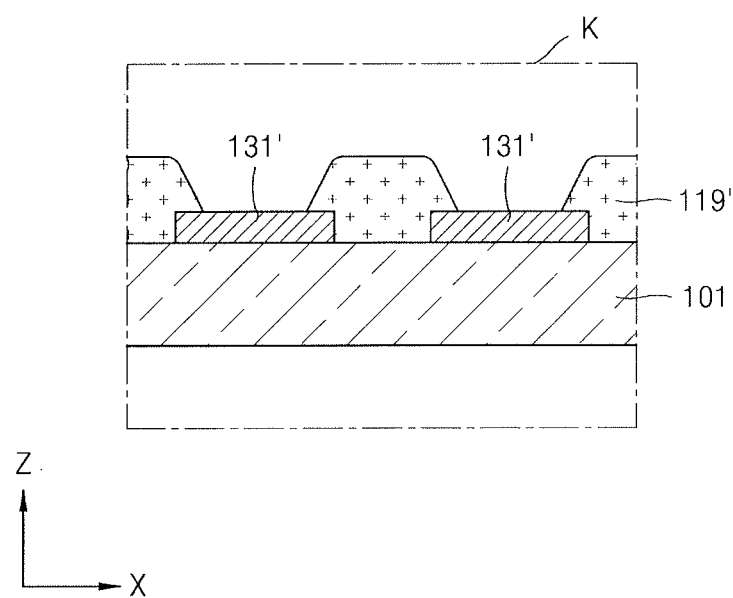

FIG. 6 illustrates a cross-sectional view of a modified example of FIG. 5.

Referring to FIG. 6, a first electrode 131' may be formed on the substrate 101. A pixel-defining layer 119' may be formed on the first electrode 131' such that a certain region of the first electrode 131' is exposed.

The pixel-defining layer 119' may be formed by using a suitable material. For example, the pixel-defining layer 119' may include an organic material or may include an inorganic material.

According to an embodiment, the pixel-defining layer 119' may include a PI-based material or an acryl-based material.

Figure 7:
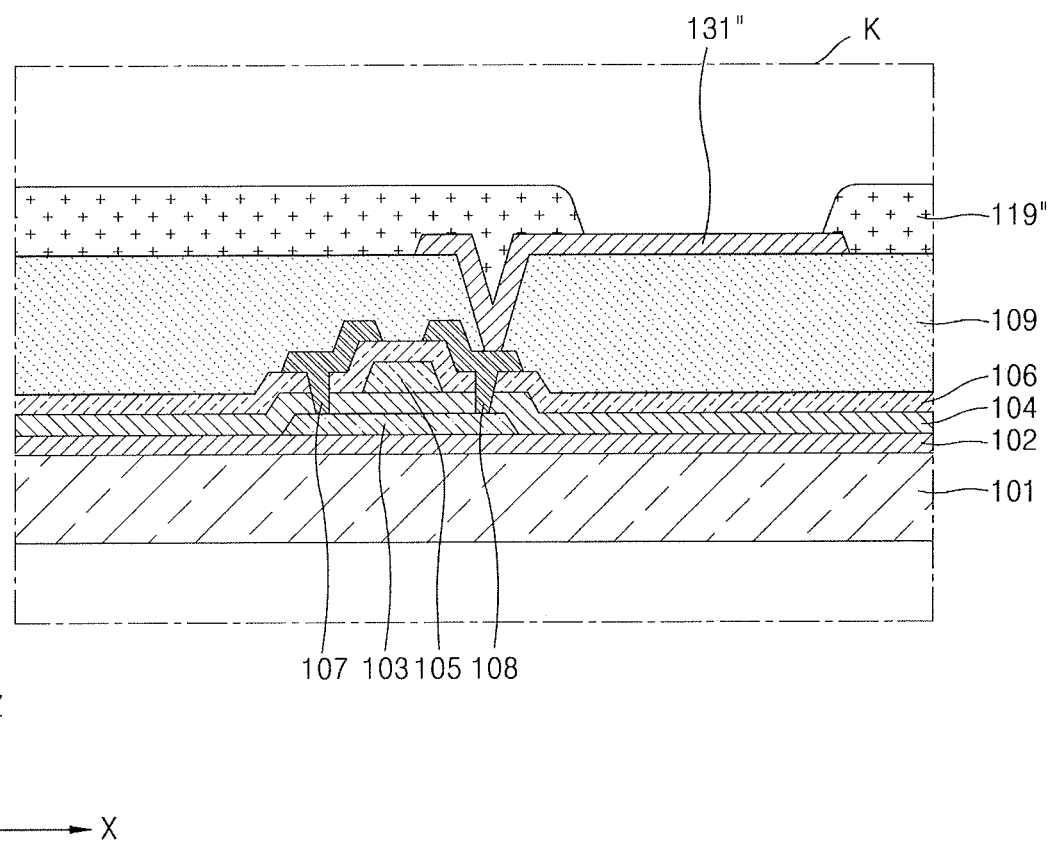

FIG. 7 illustrates a cross-sectional view of a modified example of FIG. 5.

Referring to FIG. 7, the display preliminary structure 100A may include a first electrode 131" and at least one thin-film transistor. The thin-film transistor may include an active layer 103, a gate electrode 105, a source electrode 107, and a drain electrode 108.

According to an embodiment, the at least one thin-film transistor may be electrically connected to the first electrode 131".

The active layer 103 may be formed over the substrate 101. According to an embodiment, a buffer layer 102 may be formed between the substrate 101 and the active layer 103.

The buffer layer 102 may be formed by using a suitable insulating material.

The active layer 103 may include an inorganic semiconductor material such as silicon, an organic semiconductor material, or an oxide semiconductor material. The active layer 103 may be formed, for example, by injecting a p-type or n-type dopant.

The gate electrode 105 may be formed, for example, over the active layer 103 to overlap the active layer 103.

A gate insulating layer 104 may be formed on the active layer 103 to be between the gate electrode 105 and the active layer 103.

The gate insulating layer 104 may insulate the gate electrode 105 from the active layer 103.

An interlayer insulating layer 106 may be formed to cover the gate electrode 105. The source and drain electrodes 107 and 108 may be formed on the interlayer insulating layer 106.

The source and drain electrodes 107 and 108 may be insulated from the gate electrode 105 and may contact a certain region of the active layer 103.

A passivation layer 109 may be formed to cover the source and drain electrodes 107 and 108. The passivation layer 109 may be formed by using a suitable materials. For example, the passivation layer 109 may be formed by using an organic material or an inorganic material.

According to an embodiment, the passivation layer 109 may include a P1-based material or an acryl-based material.

According to an embodiment, a top surface of the passivation layer 109 may have a flat surface. In some implementations, a planarization layer may be further formed on the passivation layer 109.

The first electrode 131" may be formed on the passivation layer 109.

The first electrode 131" may be electrically connected to one of the source electrode 107 and the drain electrode 108. For convenience of description, the first electrode 131" is shown in FIG. 7 as being connected to the drain electrode 108.

A pixel-defining layer 119" may be formed on the first electrode 131". The pixel-defining layer 119" may be formed such that a certain region of a top surface of at least the first electrode 131" is not covered.

Figure 8:
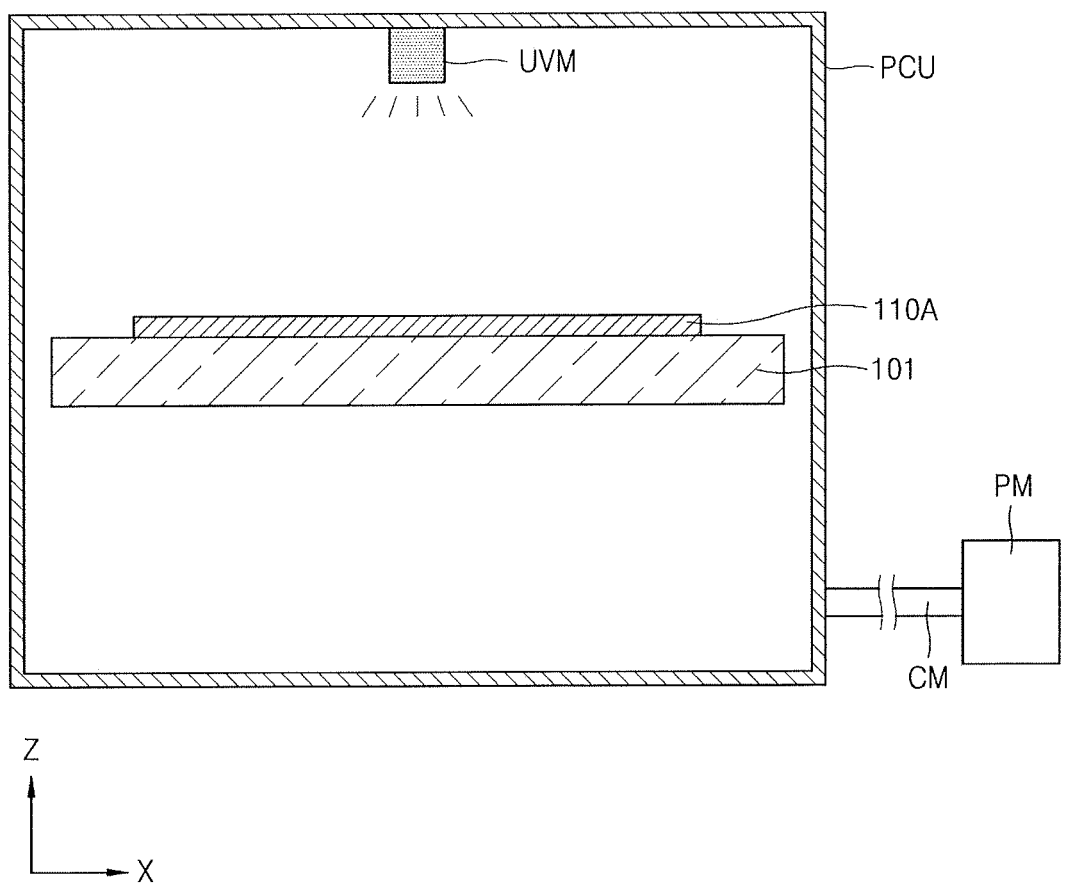

Referring to FIG. 8, a treatment process may be performed after arranging the substrate 101 on which the display preliminary structure 110A is formed in a processing chamber PCU. For example, a vacuum atmosphere treatment and an ultraviolet ray irradiating process may be performed on the substrate 101 on which the display preliminary structure 110A is formed.

According to an embodiment, before the treatment process of FIG. 8, i.e., before the substrate 101 on which the display preliminary structure 110A is formed are arranged in the processing chamber PCU, a cleaning process may be performed. Accordingly, a vacuum atmosphere of the processing chamber PCU may be easily maintained, and contamination or damage by an ultraviolet ray irradiator UVM may be prevented or reduced.

According to an embodiment, a thermal treatment process may be performed before the substrate 101 on which the display preliminary structure 110A is formed is arranged in the processing chamber PCU. For example, when the cleaning process is performed, the thermal treatment process may be performed after the cleaning process.

The thermal treatment process may be performed in an oven at a temperature of 100° C. to 200° C. for several to tens of minutes.

According to an embodiment, a cooling treatment process may be performed on the substrate 101 after the thermal treatment process. For example, a room temperature treatment process may be performed for several to tens of minutes.

Referring to FIG. 8, the processing chamber PCU may maintain a pressure atmosphere that is lower than atmospheric pressure while the substrate 101 on which the display preliminary structure 110A is formed is arranged therein.

According to an embodiment, the processing chamber PCU may maintain a vacuum atmosphere lower than or equal to 0.01 Pa. For example, the processing chamber PCU may maintain low pressure of 0.001 Pa to 0.000001 Pa, i.e., a high vacuum degree.

The processing chamber PCU may be connected to a pump PM through a connector CM. Accordingly, the vacuum atmosphere of the processing chamber PCU may be easily and quickly controlled and the internal pressure of the processing chamber PCU may be changed.

The processing chamber PCU may include the ultraviolet ray irradiator UVM to perform the ultraviolet ray irradiating process on the substrate 101 on which the display preliminary structure 110A is formed.

The ultraviolet ray irradiator UVM may be arranged in the processing chamber PCU such that ultraviolet rays are irradiated in a direction of the substrate 101. According to an embodiment, when the processing chamber PCU is arranged as shown in FIG. 8 and the bottom of FIG. 8 indicates a ground direction, the ultraviolet ray irradiator UVM may be arranged above the substrate 101 while being supported by one region of the processing chamber PCU, for example, one region of the top surface of the processing chamber PCU.

The ultraviolet ray irradiator UVM may be configured to irradiate ultraviolet rays having a wavelength of 10 to 480 nm.

The ultraviolet rays may be irradiated onto the substrate 101 on which the display preliminary structure 110A has been formed while the pressure atmosphere in the processing chamber PCU is maintained to be lower than the atmospheric pressure. Thus, out-gassing from the display preliminary structure 110A may be facilitated before a display is completed. Also, impurities or out-gassed residue on the display preliminary structure 110A or an adjacent region may be easily reduced or removed.

According to an embodiment, an insulating material or an organic material forming a pixel-defining layer or a passivation layer may be easily out-gassed.

When the thermal treatment process is performed by using an oven, the amount of out-gassed residue may be increased. However, in the reduced pressure atmosphere, the out-gassed residue may be easily reduced.

A time for irradiating the ultraviolet rays onto the substrate 101 on which the display preliminary structure 110A is formed while maintaining the pressure atmosphere to be lower than the atmospheric pressure in the processing chamber PCU may be less than or equal to 1 hour. Accordingly, influence of the ultraviolet rays or heat on the substrate 101 on which the display preliminary structure 110A is formed may be reduced, and a manufacturing time of a display apparatus may be reduced.

According to an embodiment, the time for irradiating the ultraviolet rays may be within 20 minutes, for example, between 2 to 20 minutes.

When the time for irradiating the ultraviolet rays is less than 2 minutes, an out-gassing effect from the display preliminary structure 110A is not high. When the time for irradiating the ultraviolet rays is more than 20 minutes, an increase in the out-gassing effect is not large and the display preliminary structure 110A and the substrate 101 may be affected.

As an example, the time for irradiating the ultraviolet rays may be between 2 to 5 minutes.

A short time, i.e., within 1 hour, for example, 20 minutes, or as a specific example, 10 minutes, may enable easy out-gassing from the display preliminary structure 110A and easy reduction or removal of out-gassed residue.

By reducing the out-gassing while a display is formed later, pixel shrinkage may be reduced or prevented, thereby reducing or preventing an abnormal change of a color temperature.

Such a short processing time may not affect other processes and may not abnormally affect the substrate 101 and the display preliminary structure 110A.

Figure 9:
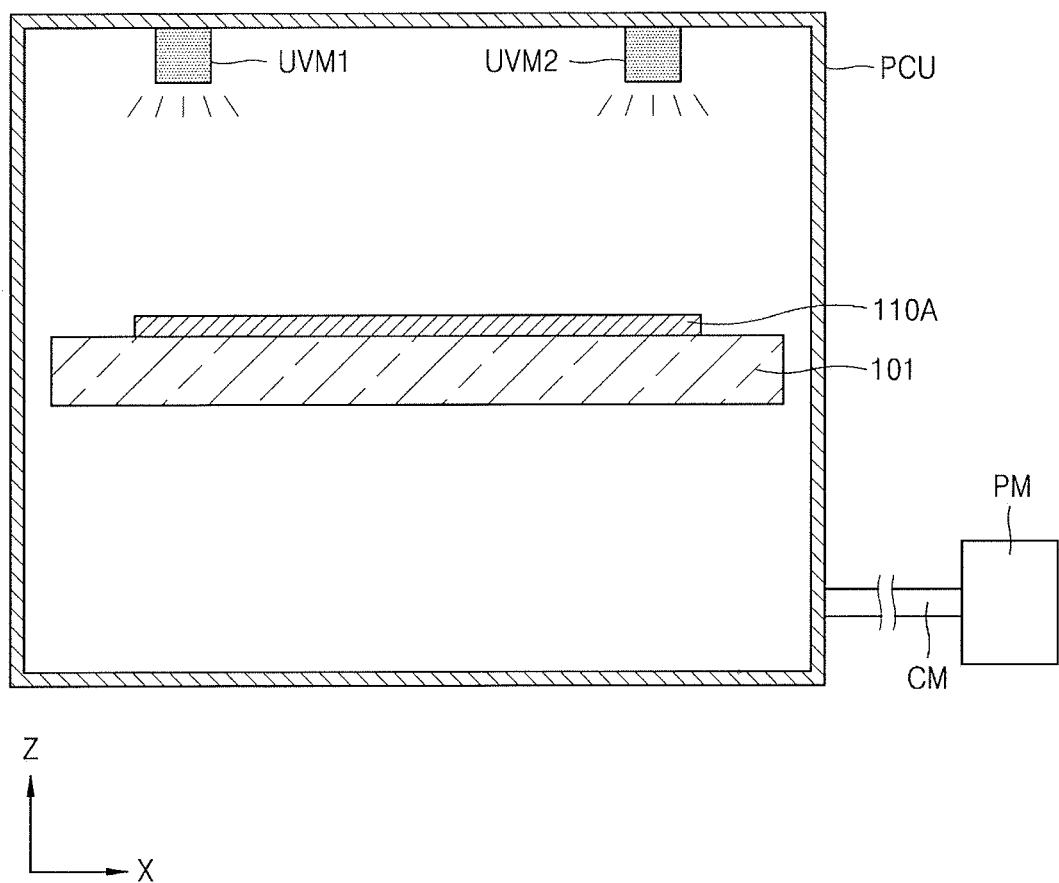

FIG. 9 illustrates a modified example of FIG. 8. For convenience of description, differences therebetween are mainly described.

Referring to FIG. 9, the processing chamber PCU may be configured to maintain the pressure atmosphere lower than the atmospheric pressure while the substrate 101 on which the display preliminary structure 110A is formed is arranged therein. According to an embodiment, the processing chamber PCU may be connected to the pump PM through the connector CM.

A first ultraviolet ray irradiator UVM1 and a second ultraviolet ray irradiator UVM2 may be arranged in the processing chamber PCU to perform ultraviolet ray, irradiating processes on the substrate 101 on which the display preliminary structure 110A is formed.

The first ultraviolet ray irradiator UVM1 and the second ultraviolet ray irradiator UVM2 may be spaced apart from each other and each arranged inside the processing chamber PCU to irradiate ultraviolet rays in a direction of the substrate 101.

According to an embodiment, the first and second ultraviolet ray irradiators UVM1 and UVM2 may be arranged over the substrate 101 to be supported by one region, for example, one region of the top surface of the processing chamber PCU.

Each of the first and second ultraviolet ray irradiators UVM1 and UVM2 may be configured to irradiate ultraviolet rays having a wavelength of 10 to 480 nm.

The first and second ultraviolet ray irradiators UVM1 and UVM2 may each irradiate ultraviolet rays onto the substrate 101 on which the display preliminary structure 110A is formed while the pressure atmosphere in the processing chamber PCU is maintained to be lower than the atmospheric pressure. Thus, the ultraviolet rays may be effectively and uniformly irradiated onto the display preliminary structure 110A, thereby facilitating quick and uniform out-gassing from the display preliminary structure 110A.

Differences in the above embodiments will now be mainly described.

Figure 10:
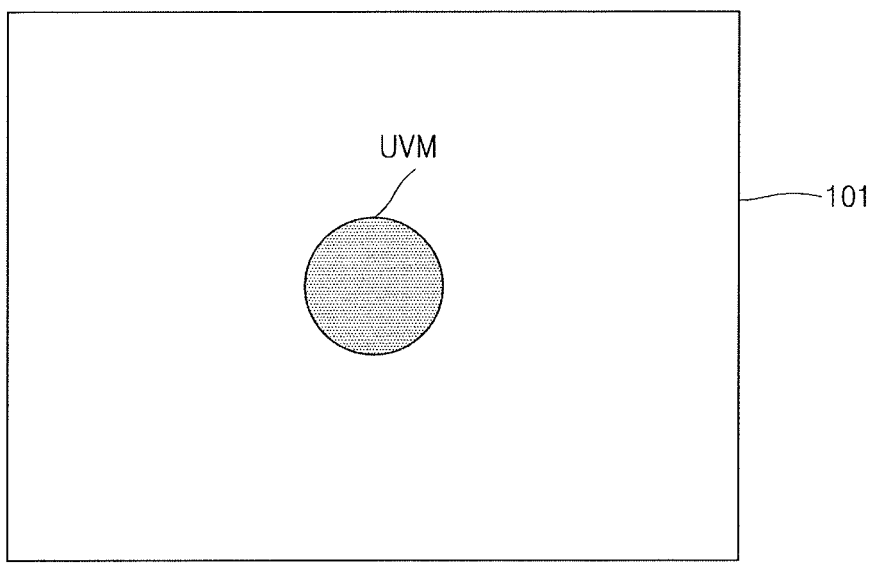

FIG. 10 illustrates a plan view of a processing chamber, for example, a plan view of the processing chamber illustrated in FIG. 8.

Referring to FIG. 10, the ultraviolet ray irradiator UVM may be arranged over the substrate 101 to correspond to a region including the center of the substrate 101 on which the display preliminary structure 110A is formed. Accordingly, the ultraviolet rays may be uniformly irradiated onto the display preliminary structure 110A.

Figure 11:
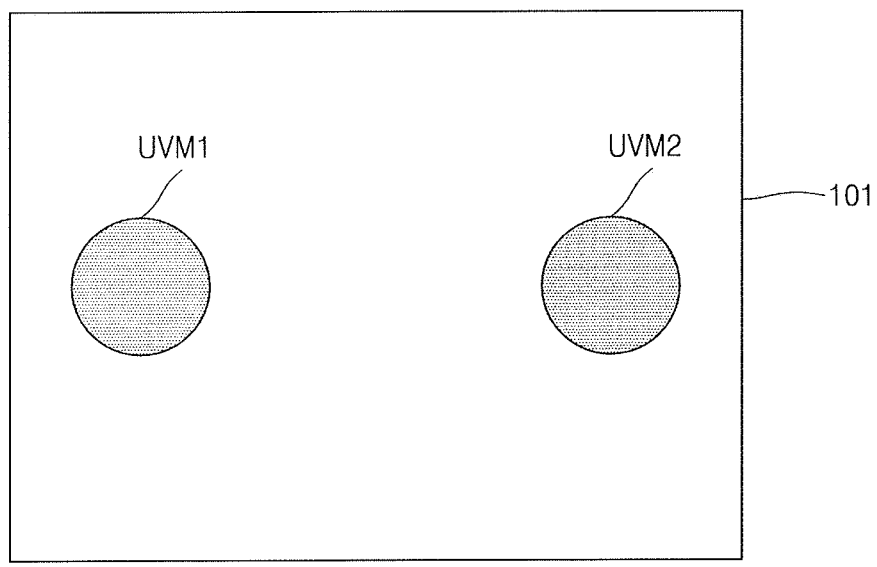

FIG. 11 illustrates a modified example of the processing chamber illustrated in FIG. 8. For convenience of description, differences therebetween are mainly described.

FIG. 11 illustrates a plan view of a processing chamber, for example, a plan view of the processing chamber illustrated in FIG. 9.

Referring to FIG. 11, the first and second ultraviolet ray irradiators UVM1 and UVM2 may be spaced apart from each other and arranged over the substrate 101. Accordingly, ultraviolet rays may be quickly and uniformly irradiated onto the display preliminary structure 110A.

Figure 12:
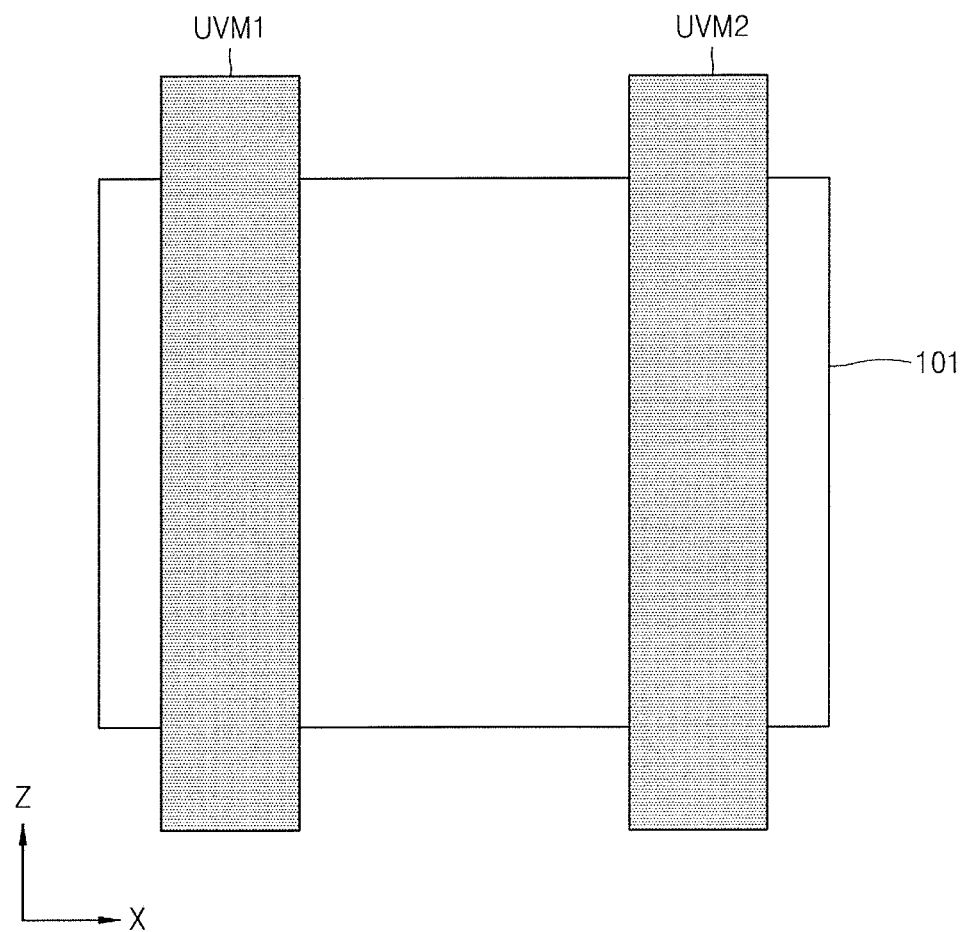

FIG. 12 illustrates a modified example of the processing chamber illustrated in FIG. 8. For convenience of description, differences therebetween are mainly described.

FIG. 12 illustrates a plan view of a processing chamber.

Referring to FIG. 12, the first and second ultraviolet ray irradiators UVM1 and UMV2 may be spaced apart from each other and each elongated.

For example, the length of each of the first and second ultraviolet ray irradiators UVM1 and UVM2 in at least one direction may correspond to the width of the substrate 101 in one direction. According to an embodiment, the length of each of the first and second ultraviolet ray irradiators UVM1 and UVM2 in at least one direction may be Greater than the width of the substrate 101 in one direction.

In some implementations, the length of each of the first and second ultraviolet ray irradiators UVM1 and UVM2 in at least one direction may be less than the width of the substrate 101 in one direction.

A uniform out-gassing characteristic in a width direction of the substrate 101 may be obtained through such linear first and second ultraviolet ray irradiators UVM1 and UVM2. Effective out-gassing may be facilitated with respect to the display preliminary structure 110A at regions corresponding to the center and edge of the substrate 101.

Figure 13:
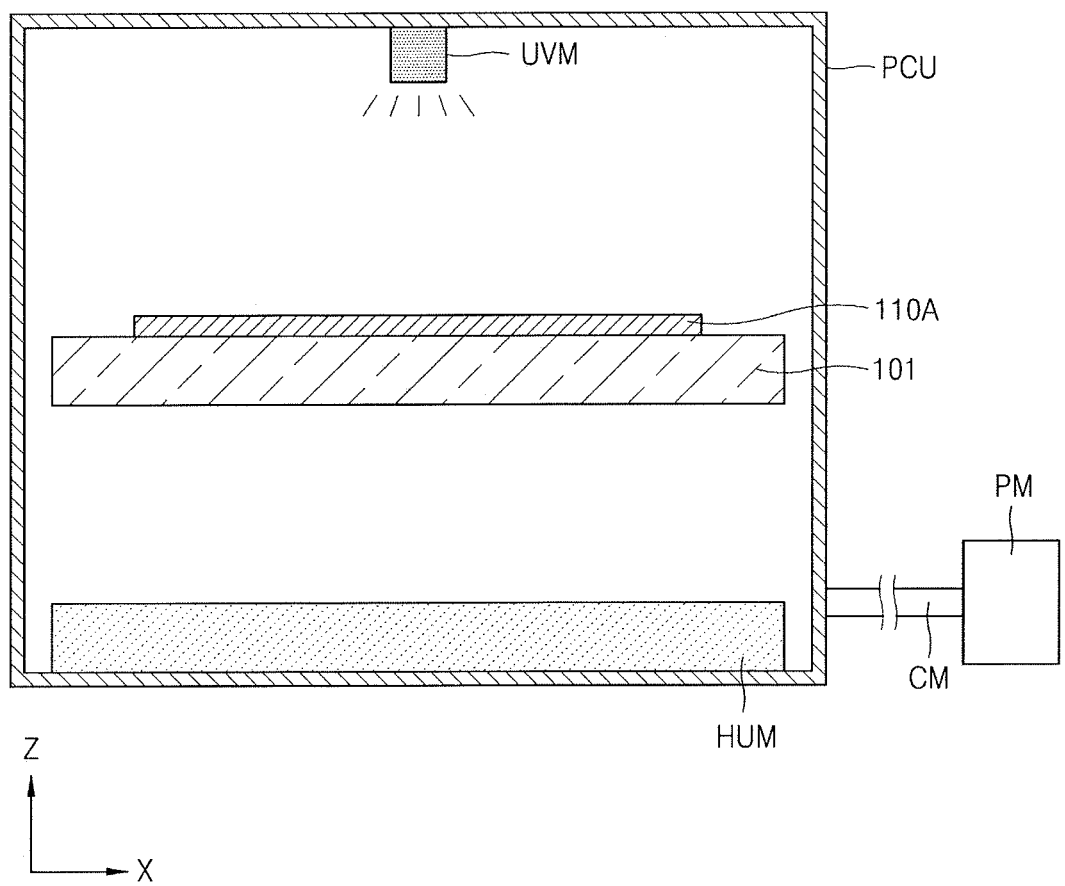

FIG. 13 illustrates a diagram showing another modified example of the processing chamber illustrated in FIG. 8. For convenience of description, differences therebetween are mainly described.

Referring to FIG. 13, the processing chamber PCU may be configured such that a pressure atmosphere lower than the atmospheric pressure is maintained while the substrate 101 on which the display preliminary structure 110A is formed is arranged therein. According to an embodiment, the processing chamber PCU may be connected to the pump PM through the connector CM.

The processing chamber PCU may include the ultraviolet ray irradiator UVM configured to irradiate ultraviolet rays onto the substrate 101 on which the display preliminary structure 110A is formed.

The processing chamber PCU may include a heater HUM configured to apply heat to the substrate 101 on which the display preliminary structure 110A is formed.

The heater HUM may include a suitable heat source, For example, the heater HUM may include a hot wire. The heater HUM may supply heat less than or equal to 200° C. to the substrate 101. Accordingly, the display preliminary structure 110A and the substrate 101 may be prevented from being thermally damaged during a heating process through the heater HUM.

The ultraviolet rays may be irradiated on the substrate 101 on which the display preliminary structure 110A is formed while maintaining the pressure atmosphere in the processing chamber PCU to be lower than the atmospheric pressure. Thus, out-gassing from the display preliminary structure 110A may be facilitated before a display is completed. Impurities or out-gassed residue on the display preliminary structure 110A or an adjacent region may be easily reduced or removed.

The heater HUM may supply heat to the substrate 101 on which the display preliminary structure 110A is formed during a treatment process in the processing chamber PCU. Accordingly, the efficiency of the treatment process in the processing chamber PCU with respect to the substrate 101 on which the display preliminary structure 110A is formed may be increased and a processing time may be reduced.

As such, out-gassing from the display preliminary structure 110A may be facilitated and out-gassed residue may be easily removed or reduced. Out-gassing may be effectively performed so as to reduce the out-gassing while a display is formed later, thereby preventing poor image quality or deterioration of image characteristics of a display apparatus.

Figure 14:
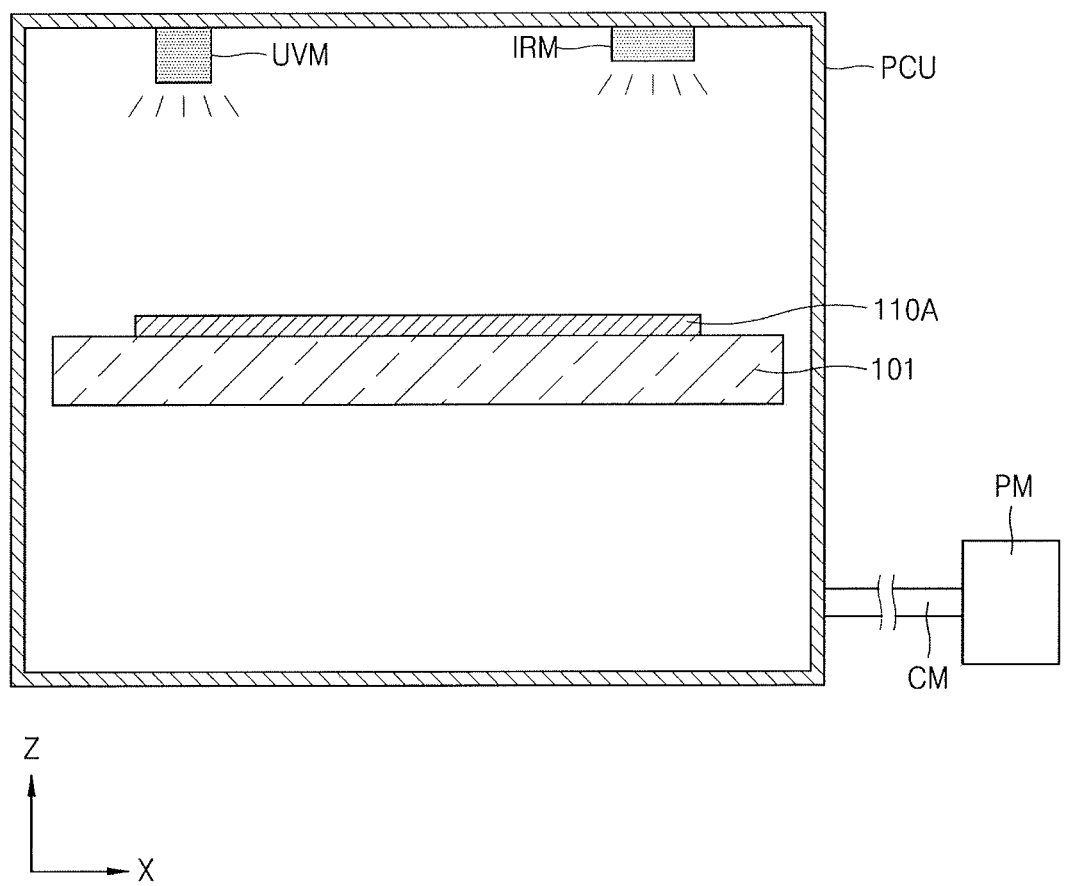

FIG. 14 illustrates a diagram of another modified example of the processing chamber illustrated in FIG. 8. For convenience of description, differences therebetween are mainly described.

Referring to FIG. 14, the processing chamber PCU may be configured to maintain a pressure atmosphere lower than the atmospheric pressure while the substrate 101 on which the display preliminary structure 110A is formed is arranged therein. According to an embodiment, the processing chamber PCU may be connected to the pump PM through the connector CM.

The processing chamber PCU may include the ultraviolet ray irradiator UVM configured to perform the ultraviolet ray irradiating process on the substrate 101 on which the display preliminary structure 110A is formed.

Also, the processing chamber PCU may include an infrared ray irradiator IRM configured to irradiate infrared rays onto the substrate 101 on which the display preliminary structure 110A is formed.

The infrared ray irradiator IRM may have a suitable form. For example, the infrared ray irradiator IRM may be an infrared ray irradiating lamp. The infrared ray irradiator IRM may supply heat less than or equal to 200° C. to the substrate 101. Accordingly, the display preliminary structure 110A and the substrate 101 may be prevented from being thermally damaged during a heating process through the infrared ray irradiator IRM.

The infrared ray irradiator IRM may be spaced apart from the ultraviolet ray irradiator UVM and may be arranged in the processing chamber PCU to irradiate infrared rays in a direction of the substrate 101.

According to an embodiment, the infrared ray irradiator IRM may be arranged above the substrate 101 to be supported by one region, for example, one region of a top surface of the processing chamber PCU.

Out-gassing from the display preliminary structure 110A may be facilitated before a display is completed by irradiating the ultraviolet rays to the substrate 101 on which the display preliminary structure 110A is formed while maintaining the pressure atmosphere to be less than the atmospheric pressure in the processing chamber PCU. Impurities or out-gassed residue on the display preliminary structure 110A or an adjacent region may be easily reduced or removed.

The infrared ray irradiator IRM may irradiate infrared rays onto the substrate 101 on which the display preliminary structure 110A is formed during a treatment process of the processing chamber PCU. Accordingly, the efficiency of the treatment process in the processing chamber PCU on the substrate 101 on which the display preliminary structure 110A is formed may be increased and a processing time may be reduced.

As such, out-gassing from the display preliminary structure 110A may be facilitated and out-gassed residue may be easily removed or reduced. Also, out-gassing may be effectively performed so as to reduce the out-gassing while a display is formed later, thereby preventing poor image quality or deterioration of image characteristics of a display apparatus.

Figure 15:
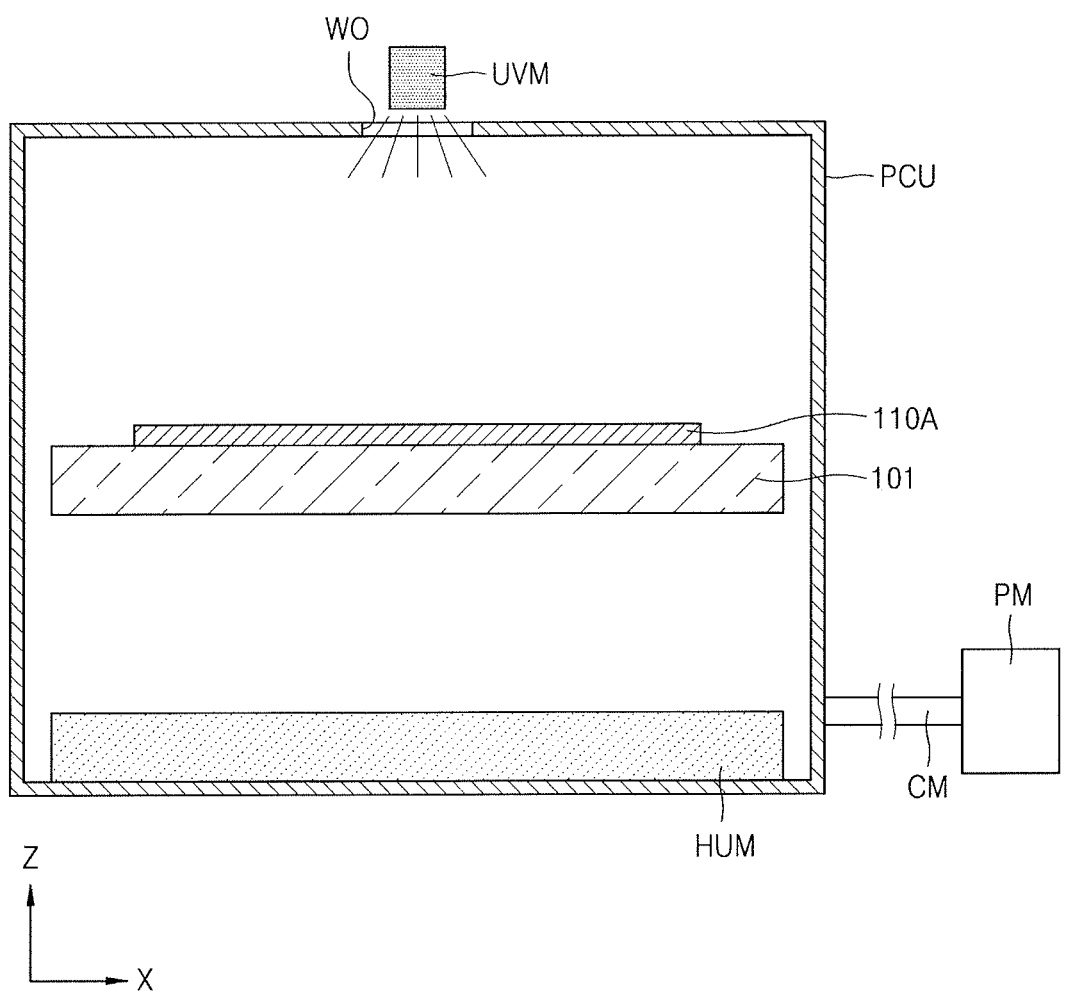

FIG. 15 illustrates a diagram of another modified example of the processing chamber illustrated in FIG. 8. For convenience of description, differences therebetween are mainly described.

Referring to FIG. 15, the processing chamber PCU may be configured to maintain a pressure atmosphere lower than the atmospheric pressure while the substrate 101 on which the display preliminary structure 110A is formed is arranged therein. According to an embodiment, the processing chamber PCU may be connected to the pump PM through the connector CM.

The ultraviolet ray irradiator UVM may be arranged in a region adjacent to the processing chamber PCU to perform an ultraviolet ray irradiating process on the substrate 101 on which the display preliminary structure 110A is formed.

The processing chamber PCU may include, on at least one region, a window WD for transmitting ultraviolet rays. The ultraviolet ray irradiator UVM may be located to correspond to the window WD.

By locating the ultraviolet ray irradiator UVM outside the processing chamber PCU, the atmosphere of the processing chamber PCU may not be affected and movement and repairing or maintaining of the ultraviolet ray irradiator UVM may be facilitated.

Also, influence of heat generated during an operation of the ultraviolet ray irradiator UVM on the processing chamber PCU may be reduced or prevented.

The processing chamber PCU may include the heater HUM to apply heat on the substrate 101 on which the display preliminary structure 110A is formed.

The heater HUM may include a heat source. For example, the heater may include a hot wire.

The ultraviolet rays may be irradiated on the substrate 101 on which the display preliminary structure 110A is formed while maintaining the pressure atmosphere to be lower than the atmospheric pressure in the processing chamber PCU. Thus, out-gassing from the display preliminary structure 110A may be facilitated before a display is completed. Impurities or out-gassed residue on the display preliminary structure 110A or an adjacent region may be easily reduced or removed.

The heater HUM may supply heat to the substrate 101 on which the display preliminary structure 110A is formed during a treatment process in the processing chamber PCU. Accordingly, the efficiency of the treatment process in the processing chamber PCU with respect to the substrate 101 on which the display preliminary structure 110A is formed may be increased and a processing time may be reduced.

Figure 16:
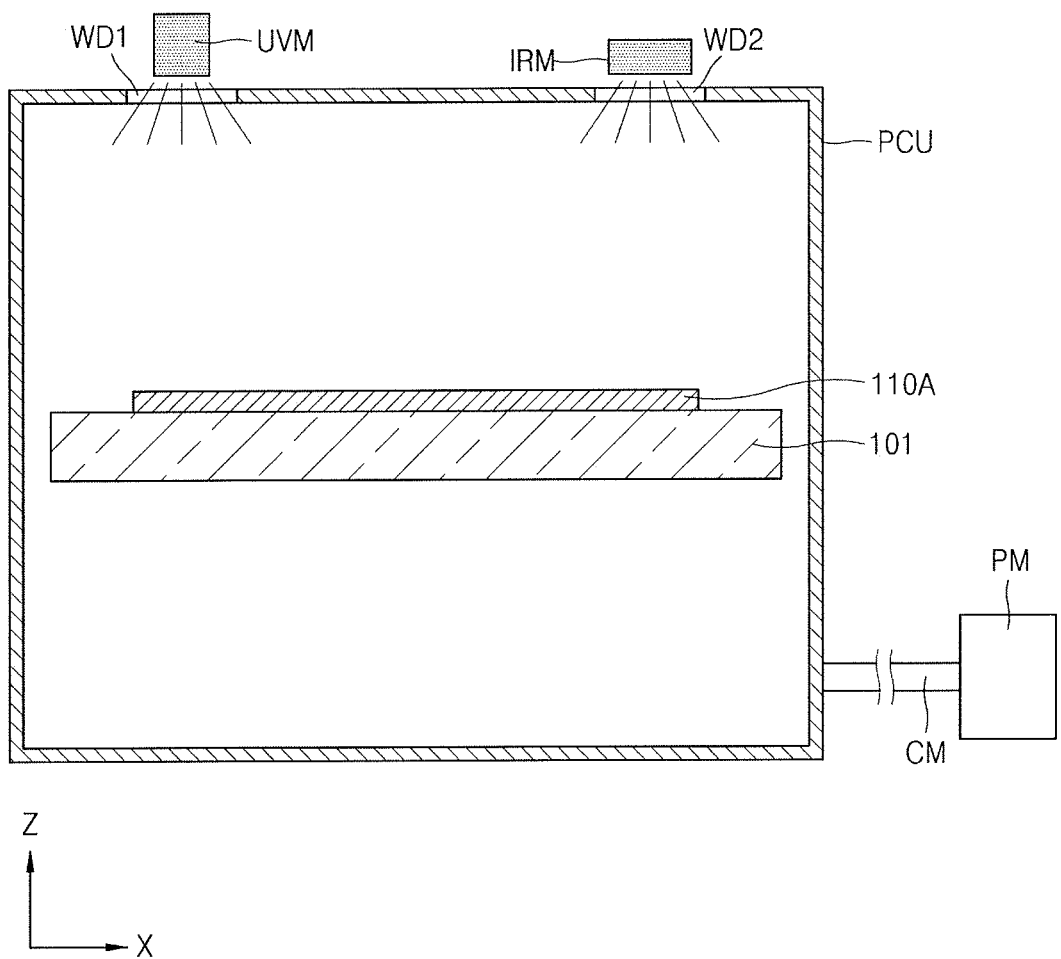

FIG. 16 illustrates a diagram of another modified example of the processing chamber illustrated in FIG. 8. For convenience of description, differences therebetween are mainly described.

Referring to FIG. 16, the processing chamber PCU may be configured to maintain a pressure atmosphere lower than the atmospheric pressure while the substrate 101 on which the display preliminary structure 110A is formed is arranged therein. According to an embodiment, the processing chamber PCU may be connected to the pump PM through the connector CM.

The ultraviolet ray irradiator UVM may be arranged in a region adjacent to the processing chamber PCU to perform an ultraviolet ray irradiating process on the substrate 101 on which the display preliminary structure 110A is formed.

The processing chamber PCU may include, on at least one region, a first window WD1 for transmitting ultraviolet rays. The ultraviolet ray irradiator UVM may be located to correspond to the first window WD1.

By locating the ultraviolet ray irradiator UVM outside the processing chamber PCU, the atmosphere of the processing chamber PCU may not be affected and movement and repairing or maintaining of the ultraviolet ray irradiator UVM may be facilitated.

The influence of heat generated during an operation of the ultraviolet ray irradiator UVM on the processing chamber PCU may be reduced or prevented.

The infrared ray irradiator IRM may be arranged in a region adjacent to the processing chamber PCU to perform an infrared ray irradiating process on the substrate 101 on which the display preliminary structure 110A is formed.

The infrared ray irradiator IRM may have a suitable form. For example, the infrared ray irradiator IRM may be an infrared ray irradiating lamp.

The processing chamber PCU may include, on at least one region, a second window WD2 for transmitting infrared rays. The infrared ray irradiator IRM may be located to correspond to the second window WD2.

By locating the infrared ray irradiator IRM outside the processing chamber PCU, the atmosphere of the processing chamber PCU may not be affected and movement and repairing or maintaining of the infrared ray irradiator IRM may be facilitated.

The influence of heat generated during an operation of the infrared ray irradiator IRM on the processing chamber PCU may be reduced or prevented.

The infrared ray irradiator IRM and the ultraviolet ray irradiator UVM may be spaced apart from each other.

Figure 17:
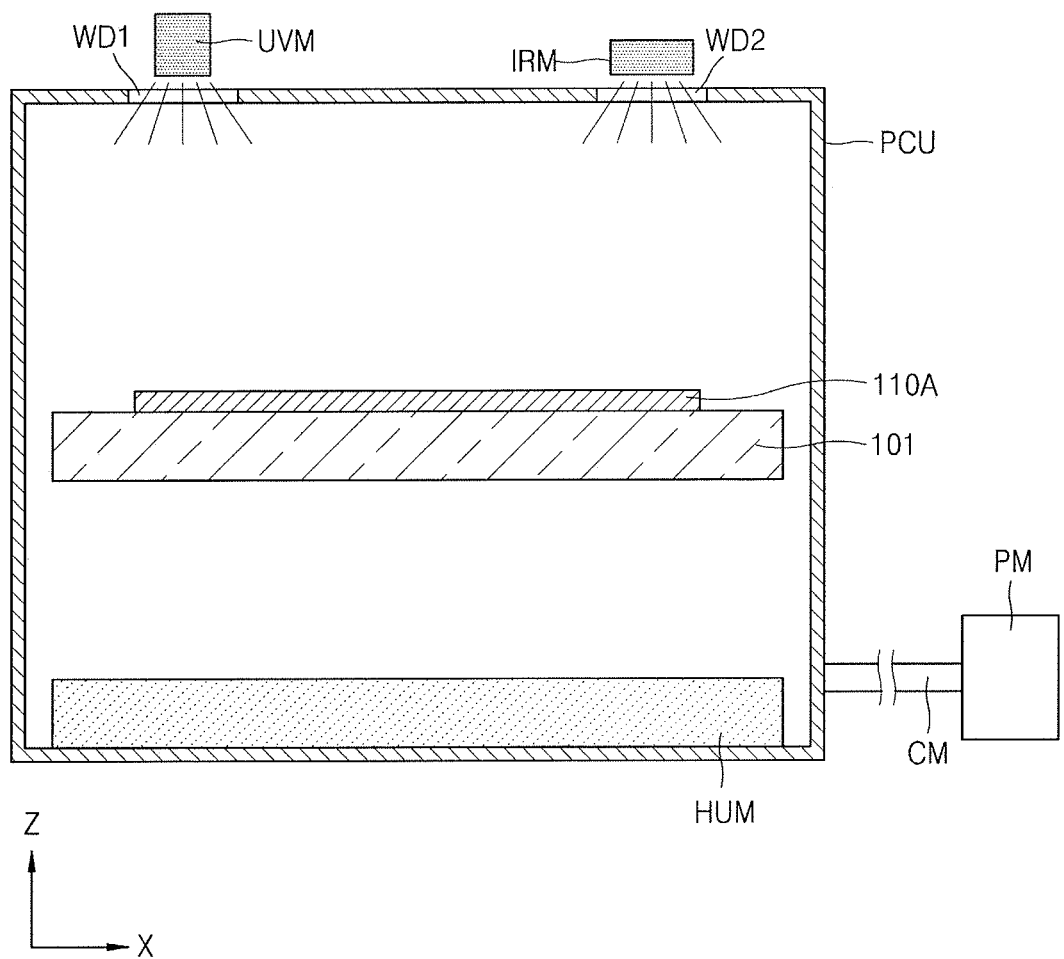

FIG. 17 illustrates a diagram of another modified example of the processing chamber illustrated in FIG. 8. For convenience of description, differences therebetween are mainly described.

Referring to FIG. 17, the processing chamber PCU may be configured to maintain a pressure atmosphere lower than the atmospheric pressure while the substrate 101 on which the display preliminary structure 110A is formed is arranged therein. According to an embodiment, the processing chamber PCU may be connected to the pump PM through the connector CM.

The ultraviolet ray irradiator UVM may be arranged in a region adjacent to the processing chamber PCU to perform an ultraviolet ray irradiating process on the substrate 101 on which the display preliminary structure 110A is formed.

The processing chamber PCU may include, on at least one region, the first window WD1 for transmitting ultraviolet rays. The ultraviolet ray irradiator UVM may be located to correspond to the first window WD1.

By locating the ultraviolet ray irradiator UVM outside the processing chamber PCU, the atmosphere of the processing chamber PCU may not be affected and movement and repairing or maintaining of the ultraviolet ray irradiator UVM may be facilitated.

The influence of heat generated during an operation of the ultraviolet ray irradiator UVM on the processing chamber PCU may be reduced or prevented.

The infrared ray irradiator IRM may be arranged in a region adjacent to the processing chamber PCU to perform an infrared ray irradiating process on the substrate 101 on which the display preliminary structure 110A is formed.

The infrared ray irradiator IRM may have a suitable form. For example, he infrared ray irradiator IRM may be an infrared ray irradiating lamp.

The processing chamber PCU may include, on at least one region, the second window WD2 for transmitting infrared rays. The infrared ray irradiator IRM may be located to correspond to the second window WD2.

By locating the infrared ray irradiator IRM outside the processing chamber PCU, the atmosphere of the processing chamber PCU may not be affected and movement and repairing or maintaining of the infrared ray irradiator IRM may be facilitated.

The influence of heat generated during an operation of the infrared ray irradiator IRM on the processing chamber PCU may be reduced or prevented.

The infrared ray irradiator IRM and the ultraviolet ray irradiator UVM may be spaced apart from each other.

The processing chamber PCU may include the heater HUM to apply heat on the substrate 101 on which the display preliminary structure 110A is formed.

The heater HUM may include a suitable heat source. For example, the heater HUM may include a hot wire.

The ultraviolet rays and the infrared rays may be irradiated onto the substrate 101 on which the display preliminary structure 110A is formed while maintaining the pressure atmosphere lower than the atmospheric pressure in the processing chamber PCU. Thus, out-gassing from the display preliminary structure 110A may be facilitated before a display is completed. In addition, the heater HUM may supply heat to the substrate 101 on which the display preliminary structure 110A is formed during a treatment process in the processing chamber PCU. Thus efficiency of the treatment process in the processing chamber PCU may be increased, and a processing time may be reduced.

The display 110 is formed by further performing processes after the treatment process of the processing chamber PCU. The encapsulation portion 190 may be formed on the display 110 to manufacture the display apparatus 100 as shown in FIG. 18.

According to an embodiment, a cleaning process may be additionally performed on the substrate 101 on which the display preliminary structure 110A is formed after the treatment process of the processing chamber PCU is performed and before the display 110 and the encapsulation portion 190 are formed.

Figure 18:
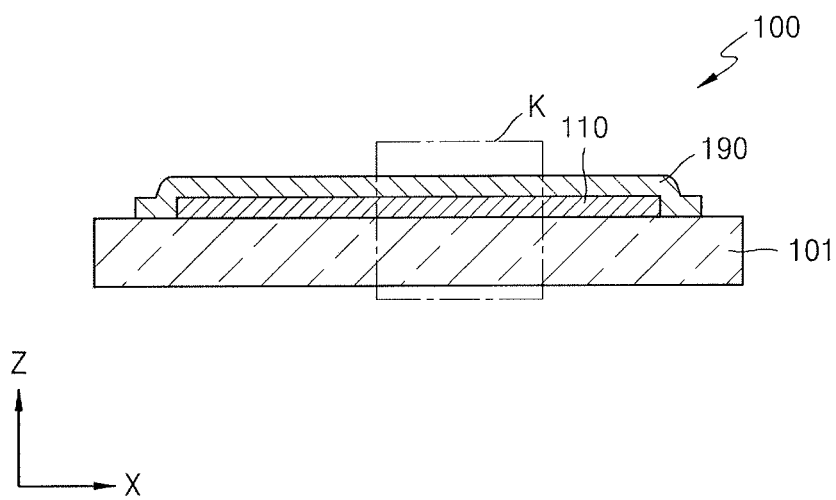
Figure 19:
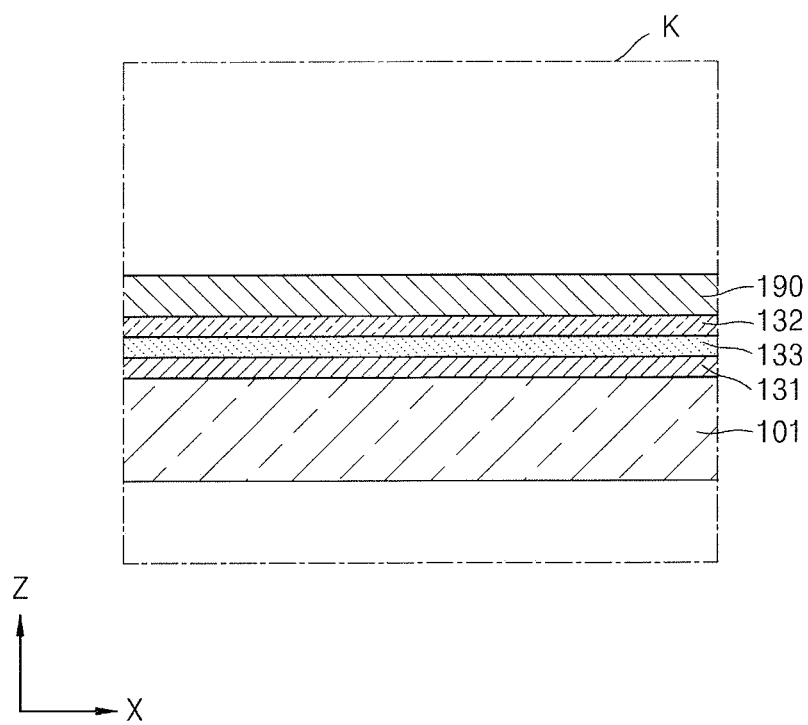

FIG. 19 illustrates an enlarged view of a region K of the display apparatus 100 as illustrated in FIG. 18. Referring to FIG. 19, a display device and the encapsulation portion 190 may be formed. For example, FIG. 19 illustrates an intermediate layer 133, a second electrode 132, and the encapsulation portion 190 formed on the first electrode 131 on the substrate 101 of FIG. 5. The display device may include the first electrode 131, the second electrode 132, and the intermediate layer 133.

The first electrode 131 has been described above, and thus details thereof are not repeated.

The intermediate layer 133 may include an organic emission layer emitting visible rays. The intermediate layer 133 may selectively include at least one of a hole injection layer, a hole transport layer, an electron transport layer, and an electron injection layer.

The second electrode 132 may be formed of a metal, such as Ag, Mg, Al, Pt, Pd, Au, Ni, Nd, Ir, Cr, Li, or Ca.

According to a an embodiment, the second electrode 132 may include ITO, IZO, ZnO, or $In_2O_3$ for light transmission.

When a voltage is applied to the intermediate layer 133 through the first and second electrodes 131 and 132, the organic emission layer of the intermediate layer 133 may emits visible rays to provide an image.

Figure 20:
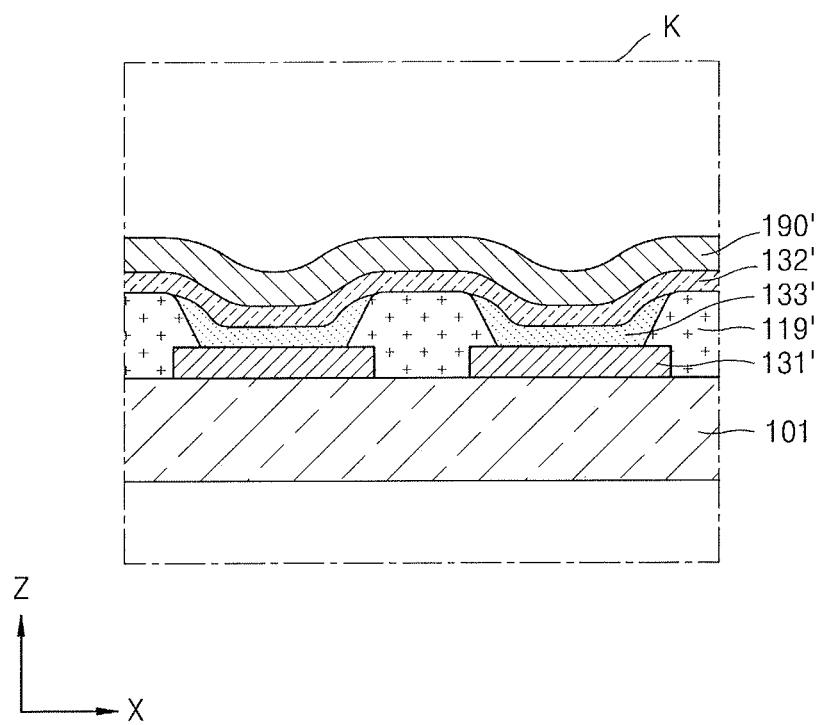

FIG. 20 illustrates a cross-sectional view of a modified example of the region K of the display apparatus 100 as illustrated in FIG. 19.

Referring to FIG. 20, a display device and an encapsulation portion 190' may be formed. For example, FIG. 20 illustrates an intermediate layer 133', a second electrode 132', and the encapsulation portion 190' formed on the first electrode 131' on the substrate 101 of FIG. 6. The display device may include the first electrode 131', the second electrode 132', and the intermediate layer 133'.

The first electrode 131' has been described above, and thus details thereof are not repeated.

The intermediate layer 133' may be formed on the first electrode 131' that is exposed by not being covered by the pixel-defining layer 119'. The intermediate layer 133' may include an organic emission layer emitting a visible ray. The intermediate layer 133' may selectively include at least one of a hole injection layer, a hole transport layer, an electron transport layer, and an electron injection layer.

The second electrode 132' may be formed on the intermediate layer 133'. According to a an embodiment, the second electrode 132' may be formed to correspond to at least one first electrode 131' or may be formed as a common electrode with respect to all pixels.

Figure 21:
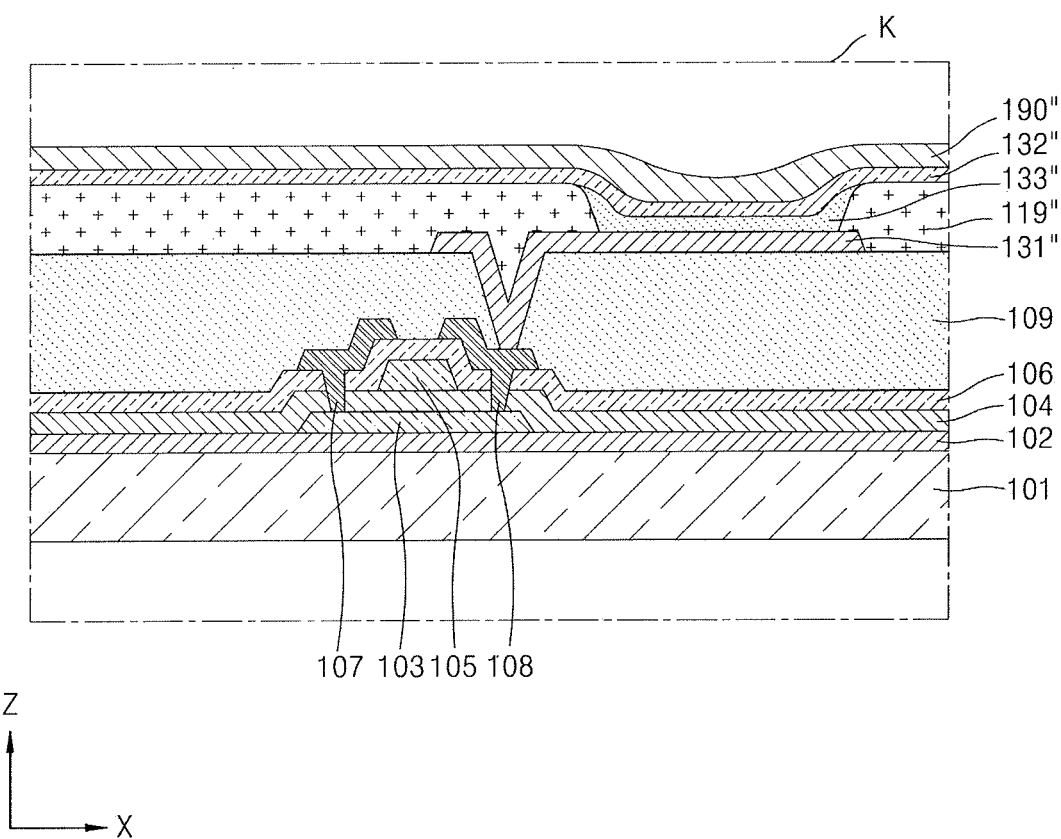

FIG. 21 illustrates a cross-sectional view of a modified example of region K of the display apparatus 100 as illustrated in FIG. 19.

Referring to FIG. 21, a display device and an encapsulation portion 190" are formed. For example, FIG. 21 illustrates an intermediate layer 133", a second electrode 132", and the encapsulation portion 190" formed on the first electrode 131" on the substrate 101 of FIG. 7. The display device may include the first electrode 131", the second electrode 132", and the intermediate layer 133".

The first electrode 131" has been described above, and thus details thereof are not repeated.

The intermediate layer 133" may be formed on the first electrode 131" that is exposed by not being covered by the pixel-defining layer 119". The intermediate layer 133' may include an organic emission layer emitting visible rays.

Also, the intermediate layer 133' may selectively include at least one of a hole injection layer, a hole transport layer, an electron transport layer, and an electron injection layer.

The second electrode 132" may be formed on the intermediate layer 133". According to an embodiment, the second electrode 132" may be formed to correspond to at least one first electrode 131" or formed as a common electrode with respect to all pixels.

As described above, according to the current embodiment, the selective embodiments, and the modified examples, ultraviolet rays may be irradiated while maintaining an atmosphere lower than atmospheric pressure, for example, a vacuum atmosphere, in a processing chamber before a display is finally formed. Thus, out-gassing may be effectively performed and a change of a color temperature or pixel shrinkage that occurs due to abnormal out-gassing during or after the display is formed may be reduced.

Table 1 shows the effect of treatment processes UV1 and UV2 as described below and of a comparative example REF in which the treatment process was not performed, on a change degree of a color temperature (TC) with respect to a design value and a value of pixel shrinkage (PS).

TABLE 1

|    | REF  | UV1  | UV2 |
|----|------|------|-----|
| TC | 657  | 492  | 380 |
| PS | 5.53 | 3.82 | 3.1 |

In detail, in Table 1, TC denotes a change degree of a color temperature with respect to a design value and PS denotes a value of pixel shrinkage.

REF denotes a process in which a treatment process of a processing chamber of the current embodiment is not performed and UV1 denotes the above embodiments, in which, for example, vacuum atmosphere was maintained 0.001 to 0.000001 Pa and ultraviolet rays less than or equal to 480 nm were irradiated to perform a treatment process for 150 seconds in the structure illustrated in FIG. 6. In UV2, in comparison with UV1, a time is the treatment process is performed for 300 seconds.

In UV1, the change degree of color temperature is reduced compared to REF. For example, the change degree is decreased from 657 to 492. Also, the value of pixel shrinkage is decreased from 5.53 to 3.82.

In UV2, the change degree of color temperature is reduced compared to REF and is more largely decreased compared to UV1. For example, the change degree of color temperature is decreased from 657 to 380, and thus an effect of alleviating color temperature reduction is higher in UV2 than in UV1. Also, the value of pixel shrinkage is decreased from 5.53 to 3.1, and thus, an effect of reducing pixel shrinkage is higher in UV2 than in UV1.

As shown in Table 1, the above embodiments perform effective out-gassing on a display preliminary structure before forming a display through processes in a processing chamber, and by increasing the efficiency of the out-gassing and reducing a time for performing the out-gassing, generation of damage while forming the display may be decreased and unnecessary out-gassing generated while forming the display may be decreased. Accordingly, image characteristics of the display are increased, thereby easily implementing a display apparatus having the increased image characteristics.

By way of summation and review, a display apparatus may include at least one display device to provide a visible ray.

In addition, the display apparatus may include at least one conductive layer or at least one insulating layer connected to or adjacent to the display device. As such, the display apparatus may include a plurality of components, and may be manufactured via a plurality of complicated processes.

When the plurality of complicated processes are performed to manufacture the display apparatus, there is a possibility that light may not be provided according to a desired design of a final display apparatus or the image quality of the display apparatus may be reduced due to undesired impurities generated during at least one process or a subsequent defect from a previous process, and thus there my be obstacles to manufacturing a display apparatus having a high image quality.

According to a display apparatus manufacturing method and a display apparatus manufacturing system of one of more embodiments, a display apparatus having high image quality may be easily manufactured and the efficiency of manufacturing processes may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus manufacturing method, comprising:
   preparing a substrate;
   forming, on the substrate, a display preliminary structure including at least one first electrode contacting the substrate;
   performing a cleaning step on the substrate on which the display preliminary structure is formed outside a processing chamber;
   out-gassing from the display preliminary structure by performing a thermal treatment process in an oven at a temperature of about 100° C. to about 200° C. for up to ten minutes after the cleaning step and before arranging the substrate in the processing chamber;
   arranging, in the processing chamber, the substrate on which the display preliminary structure is formed after the thermal treatment process, and out-gassing from the display preliminary structure and reducing an amount of out-gassed residue generated in the thermal treatment process by irradiating ultraviolet rays onto the substrate and directly onto the first electrode by using a first ultraviolet ray irradiator and a second ultraviolet ray irradiator, each having a length in a direction that corresponds to a width of the substrate in a same direction while maintaining a pressure atmosphere in the processing chamber that is lower than an atmospheric pressure;
   forming an intermediate layer on the display preliminary structure, the intermediate layer including an emission layer;
   forming a second electrode on the intermediate layer; and
   performing a cleaning process on the substrate on which the display preliminary structure is formed after irradiating the ultraviolet rays and before forming the intermediate layer,
   wherein the first ultraviolet ray irradiator and the second ultraviolet ray irradiator overlap with the substrate and have a same length in the same direction as the direction corresponding to the width of the substrate.

2. The display apparatus manufacturing method as claimed in claim 1, wherein the pressure atmosphere in the processing chamber is lower than or equal to 0.01 Pa.

3. The display apparatus manufacturing method as claimed in claim 1, wherein irradiating the ultraviolet rays includes irradiating ultraviolet rays having a wavelength range less than or equal to 480 nm.

4. The display apparatus manufacturing method as claimed in claim 1, wherein irradiating the ultraviolet rays is performed for a time less than or equal to 1 hour.

5. The display apparatus manufacturing method as claimed in claim 1, wherein irradiating the ultraviolet rays includes irradiating the ultraviolet rays by using at least one of the first and second ultraviolet ray irradiators that faces the substrate after arranging the substrate on which the display preliminary structure is formed in the processing chamber.

6. The display apparatus manufacturing method as claimed in claim 1, further comprising heating the processing chamber by using a heater during irradiating the ultraviolet rays.

7. The display apparatus manufacturing method as claimed in claim 1, further comprising irradiating infrared rays during the irradiating of the ultraviolet rays.

8. The display apparatus manufacturing method as claimed in claim 1, wherein forming the display preliminary structure includes forming a pixel-defining layer on the at least one first electrode such that a region of the at least one first electrode is exposed.

9. The display apparatus manufacturing method as claimed in claim 1, further comprising forming an encapsulation portion on the second electrode after forming the second electrode.

10. A display apparatus manufacturing method, comprising:
    preparing a substrate;
    forming, on the substrate, a display preliminary structure including at least one first electrode contacting the substrate;
    out-gassing from the display preliminary structure by performing a thermal treatment process in an oven at a temperature of about 100° C. to about 200° C. for up to ten minutes before arranging the substrate in a processing chamber;
    arranging, in the processing chamber, the substrate on which the display preliminary structure is formed, and out-gassing from the display preliminary structure and reducing an amount of out-gassed residue generated in the thermal treatment process by irradiating ultraviolet rays onto the substrate and directly onto the first electrode for about 10 minutes by using a first ultraviolet ray irradiator and a second ultraviolet ray irradiator, each having a length in a direction that corresponds to a width of the substrate in a same direction while maintaining a pressure atmosphere in the processing chamber that is lower than an atmospheric pressure;

forming an intermediate layer on the display preliminary structure, the intermediate layer including an emission layer;
forming a second electrode on the intermediate layer; and
performing a cleaning process on the substrate on which the display preliminary structure is formed after irradiating the ultraviolet rays and before forming the intermediate layer,
wherein the first ultraviolet ray irradiator and the second ultraviolet ray irradiator overlap with the substrate and have a same length in the same direction as the direction corresponding to the width of the substrate.

* * * * *